United States Patent
Ko

[11] Patent Number: 5,933,431
[45] Date of Patent: Aug. 3, 1999

[54] FRAME-BASED MODULUS INTERLEAVER

[75] Inventor: Kenneth David Ko, Clearwater, Fla.

[73] Assignee: Paradyne Corporation, Largo, Fla.

[21] Appl. No.: 08/699,124

[22] Filed: Aug. 15, 1996

[51] Int. Cl.$^6$ .................................................. H04J 3/00
[52] U.S. Cl. .......................... 370/476; 370/473; 341/81; 380/36
[58] Field of Search ..................... 370/336, 345, 370/389, 470, 471, 473, 476, 498; 371/2.1, 2.2, 37.5; 341/81; 380/36, 37; 360/48

[56] References Cited

U.S. PATENT DOCUMENTS

| | | | |
|---|---|---|---|
| 5,068,752 | 11/1991 | Tanaka et al. | 360/32 |
| 5,367,410 | 11/1994 | McCarthy | 360/48 |
| 5,438,369 | 8/1995 | Citta et al. | 348/470 |
| 5,448,555 | 9/1995 | Bremer et al. | 370/20 |
| 5,506,886 | 4/1996 | Bremer et al. | 375/216 |
| 5,511,096 | 4/1996 | Huang et al. | 375/265 |
| 5,563,887 | 10/1996 | Harasaki | 370/94.1 |
| 5,602,685 | 2/1997 | Lee | 386/47 |
| 5,617,083 | 4/1997 | Schwendeman et al. | 340/825.44 |

*Primary Examiner*—Chi H. Pham
*Assistant Examiner*—William Luther
*Attorney, Agent, or Firm*—Thomas, Kayden, Horstemeyer & Risley L.L.P.

[57] ABSTRACT

The frame based modulus interleaver is used in a digital communications system. The interleaver uses an algorithm which insures that all of the data blocks which are present in the each input frame are output in a single output frame. This is accomplished, in accordance with the invention, by using a modulus operation to determine the location of each block which is input into the interleaver.

9 Claims, 6 Drawing Sheets

FRAME-BASED MODULUS INTERLEAVER

BACKGROUND OF THE INVENTION

The present invention relates to interleavers. In particular, the invention relates to a frame-based modulus interleaver for use in a digital communications system.

In many applications, information is partitioned into discrete groups of information called "frames", each having a constant number of bits or groups of bits. The frames are generally transmitted over some communications channel and then reassembled at the receiver. Interleavers are used in communications systems to rearrange the sequencing of blocks of data (consisting of samples, individual bits, or groups of bits). Frequently, this interleaving may be for the purpose of separating correlated pieces of information, i.e., to provide statistical benefits when such data is transmitted over a communications channel. However, interleaving may be performed for other purposes as well, e.g., as part of an encryption algorithm.

The interleavers of the prior art were typically based upon procedures, which could be expressed in a formula or algorithmically. What they did was to "interleave" blocks of data prior to transmission, in order to obtain the statistical benefits which are realized by the randomized nature of the interleaved blocks which are transmitted over the communications channel. In the interleavers of the prior art, some of the interleaved blocks were typically moved from one frame to the next during the interleaving process.

A problem which has existed in the interleavers of the prior art is that when the original (non-interleaved) sampled data was interleaved, there was no way to insure that for each input (non-interleaved) frame, all of the data blocks which were in the frame which was input into the interleaver would also occupy a single frame which was output by the interleaver. Consequently, if there was some problem in the transmission of an interleaved frame over a communications channel, it could affect not only the frame which experienced the problem, but also one or more adjacent frames.

While foregoing problem had minimal impact upon the operation of many communications applications, in some applications, e.g., modems which are used for simultaneous transmission and reception of both voice and data ("SVD" modems), it would be desirable to have an interleaver which provided a one-to-one relationship between the (non-interleaved) data frames which go into the interleaver and the interleaved data frames which are output by the interleaver. In particular, it would be desirable to have all of the data blocks which were originally located within a given input frame within the same output frame, so that when the frame was transmitted, all of the data blocks would be in the same interleaved frame. Then, if a frame were to be lost or corrupted, it would not affect the samples in adjacent frames.

SUMMARY OF THE INVENTION

In accordance with the preferred embodiment of the invention, the frame based modulus interleaver of the present invention provides a mechanism for keeping interleaved samples within the frame in which they started. The frame based interleaver comprises means for placing sample blocks from a single input frame into a single output frame.

The interleaver and de-interleaver algorithms are provided below. In the de-interleaver algorithm provided, the constant propagation delay is subtracted from the output index so that the output samples are aligned with the frame boundaries.

In the preferred embodiment of the invention, the interleaver delays increase sequentially, and the de-interleaver delays use a repeating pattern which must be established in the design phase, while in an alternative embodiment of the invention, the de-interleaver delays increase sequentially, and the interleaver delays use a repeating pattern which must be established in the design phase.

DETAILED DESCRIPTION OF THE PREFERRED EMBODIMENT OF THE INVENTION

Figure 1:
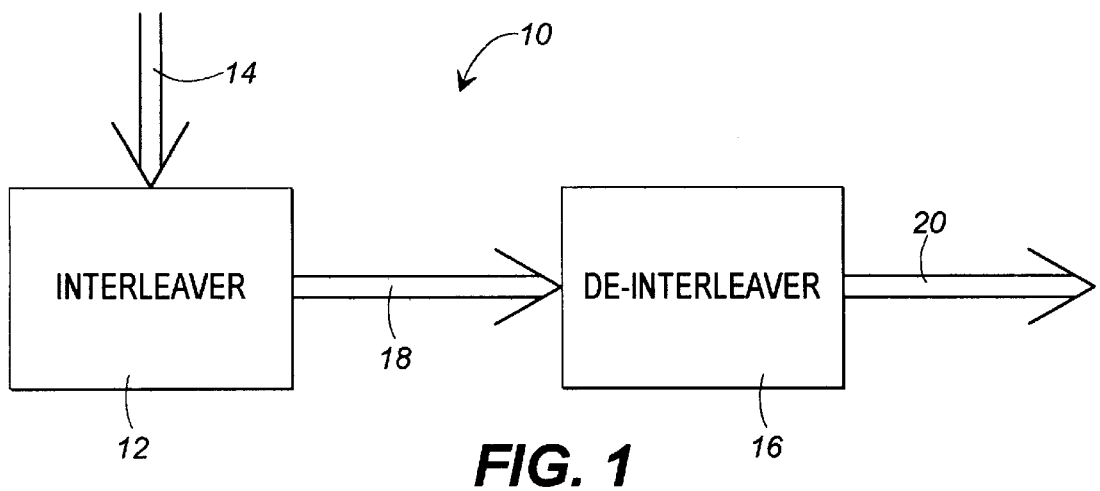
FIG. 1 is a block diagram of a typical communications system of the type referred to herein.

Referring to FIG. 1, in accordance with the preferred embodiment of the present invention, a communications system 10 is shown to receive data on an input bus 14. The data is passed into an interleaver 12 which is made in accordance with the teachings of the present invention. The interleaver 12 processes the data on a frame by frame basis, and then passes the interleaved data over a communications channel 18 to a de-interleaver 16 which reforms the interleaved data back into the original data frames and outputs it on a bus 20 where it will have the same format as the original data which was on input bus 14, albeit somewhat delayed.

In accordance with present invention, the interleaver 12 differs from the interleavers of the prior art in that it is a frame-based modulus interleaver which is able to receive data samples which are in the form of data blocks in individual input frames, interleave the data blocks, and then output frames of interleaved data which include, on a frame by frame basis, all of the sample data which was in each input frame. Thus, the frame-based modulus interleaver 12 of the present invention does not move sample blocks from one frame to another, as was done by the interleavers of the prior art. Accordingly, each of the data frames which are output on the communications channel 18 by the interleaver 12 include all of the sample data included in each of the input frames which are input into the interleaver 12 on the input bus 14. Thus, the frame-based modulus interleaver 12 of the present invention provides a mechanism for keeping interleaved samples (received on bus 14 by the interleaver 12) within the frame in which they started and outputting the interleaved data in a single frame on the communications channel 18.

Figure 2:
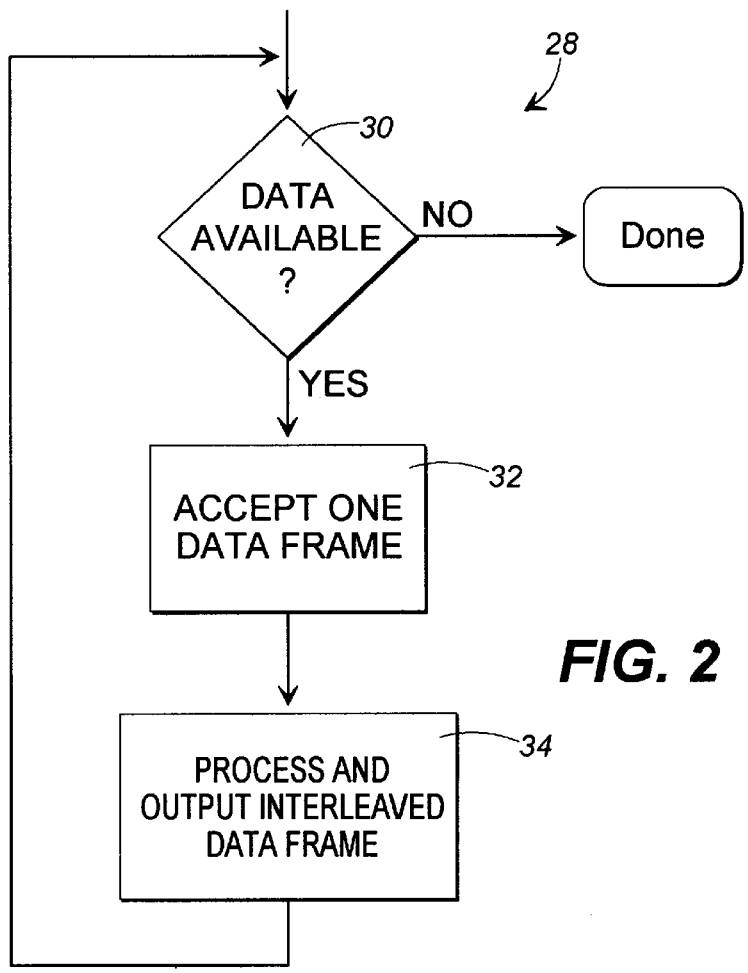
FIG. 2 is a flow chart illustrating the manner in which individual frames of data are interleaved and transmitted in output frames which correspond to the individual input frames received by the interleaver of the present invention.

Referring to FIG. 2, a flow chart 28 illustrating the overall method of the present invention is shown. With reference to the flow chart 28, if data is available 30, a frame of data is input into the interleaver 12. Each data frame is individually processed 32 by the interleaver 12, and the processed (interleaved) frame is output 34 by the interleaver 12, before another data frame is input into the interleaver 12.

As will be obvious to those skilled in the art, the interleaving performed by the present invention requires that each block of input data be reformatted in such a way that the input blocks are transposed to fit within a single frame, with no empty blocks, and with no overlapping of data blocks within a frame.

In order to accomplish the interleaving in accordance with the present invention, one first selects several parameters, which include:

| Parameter | Description |
| --- | --- |
| FS | corresponding to the frame size, i.e., the number of blocks in a frame; |
| P | the length of the interleaver delay sequence; |
| D | the increment used in the interleaver delay sequence; |
| S | the base value used to determine the interleaver delay (which determines the initial delay value in the sequence); and |
| Offset | an offset, which is a constant which is added to the frame size to create the modulus value for recovering samples which are shifted out of the original frame. |

From the foregoing, the following can be computed:

| Parameter | Description |
| --- | --- |
| Delay | the propagation delay of the interleaver/de-interleaver pair, which is equal to $D(P - 1)$; and |
| DelayVal() | the array of length P containing the de-interleaver delay sequence. |

In selecting the foregoing parameters, P and (D+1) must be relatively prime, i.e., they must have no common factors. The propagation delay through the interleaver/de-interleaver pair is $D(P-1)$. This is also the maximum delay experienced by any sample in either the interleaver or the de-interleaver.

Although the de-interleaver delays can be established by inspection in the design phase, due to the many-to-one nature of the modulus operation (n mod P) used in the interleaver delay determination, there is no easy rule for generating the delay for a specific y(m) directly from the received index, m. In practice, the de-interleaver delay sequence (and also the interleaver delay sequence) is stored in an array, DelayValo, of size P, and the delay values are retrieved from the array as needed.

Figure 3:
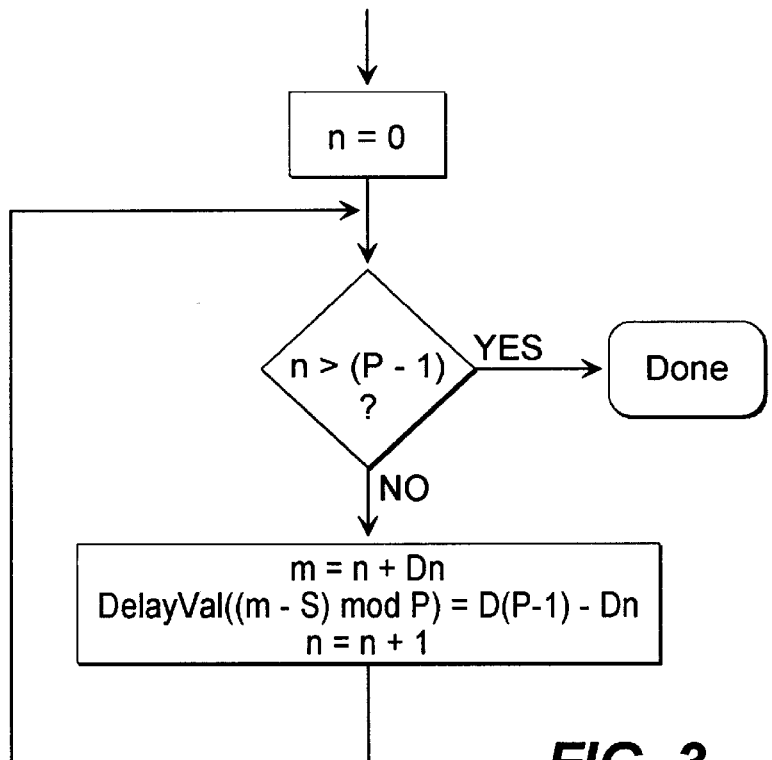
FIG. 3 is a flow chart illustrating the manner in which the members of the DelayVal( ) array are selected.

The P delay values for the de-interleaver array, DelayVal( ) can be determined in accordance with the procedure set forth in the flow chart of FIG. 3 which implements the following pseudocode:

For $n = 0$ to $(P - 1)$ $m = n + Dn$ $DelayVal((m - S) \bmod P) = D(P - 1) - Dn$ Next $n$ As described above, the frame based modulus interleaver of the present invention provides a mechanism for keeping interleaved samples within the same frame as the one in which they started. A generalized method for designing the frame-based modulus interleaver based upon the values of P, D, and the frame size, FS, is described in accordance with the present invention which uses an algorithm to place sample blocks which would otherwise be shifted out of the frame into vacant positions within the frame.

The interleaver and de-interleaver algorithms are provided below. In the de-interleaver algorithm, the constant propagation delay is subtracted from the output index so that the output samples are aligned with the frame boundaries.

Figure 4:
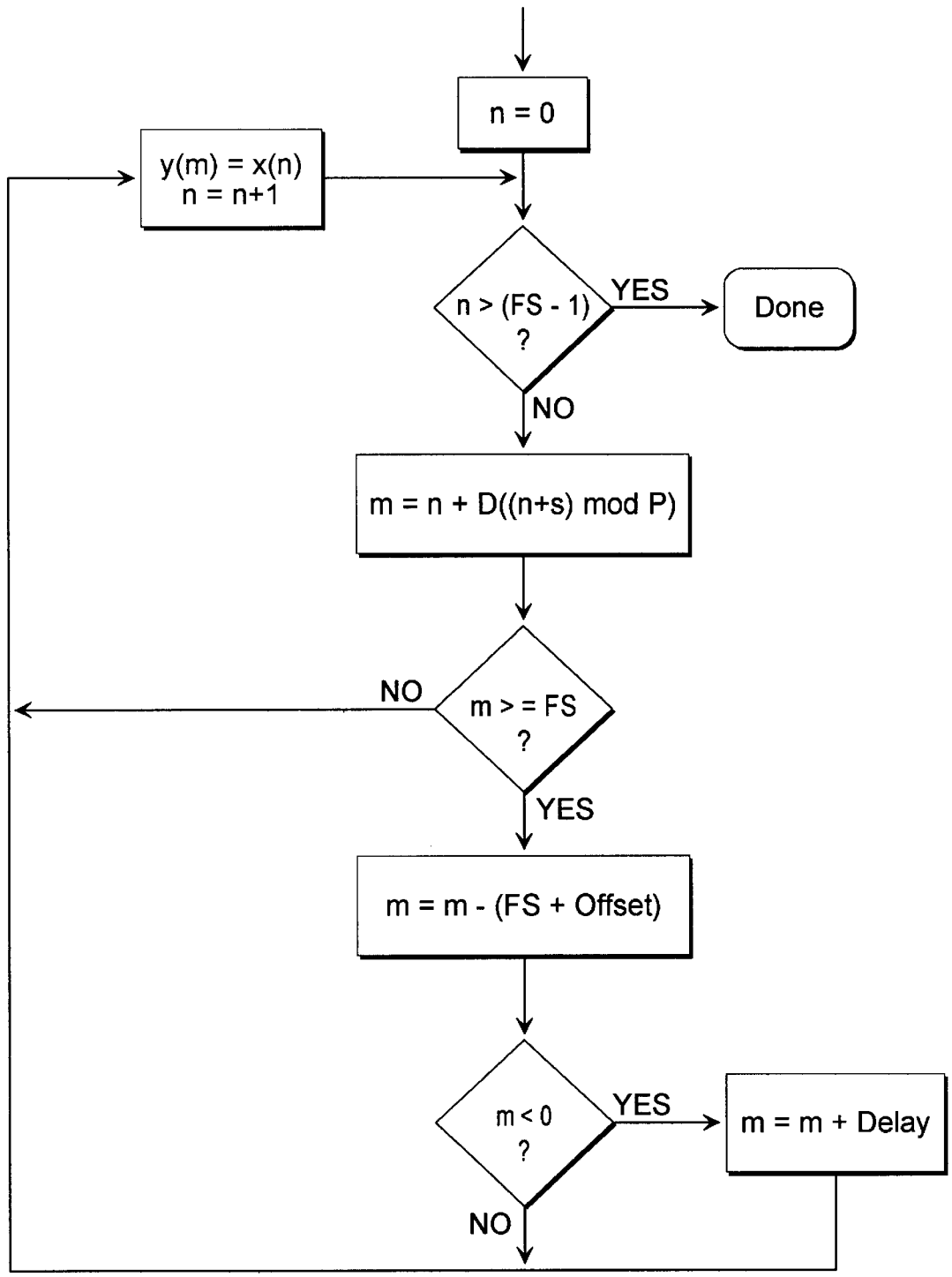
FIG. 4 is a flow chart illustrating the manner in which the interleaver of the present invention operates.

In accordance with the invention, the interleaver algorithm is described with reference to FIG. 4, and in pseudocode as follows:

For $n = 0$ to $(FS - 1)$ $m = n + D((n + S) \bmod P)$

If $m \geq FS$ then $m = m - (FS + \textit{Offset})$

If $m < 0$ then $m = m + Delay$

End if

End if $y(m) = x(n)$

Next $n$

Figure 5:
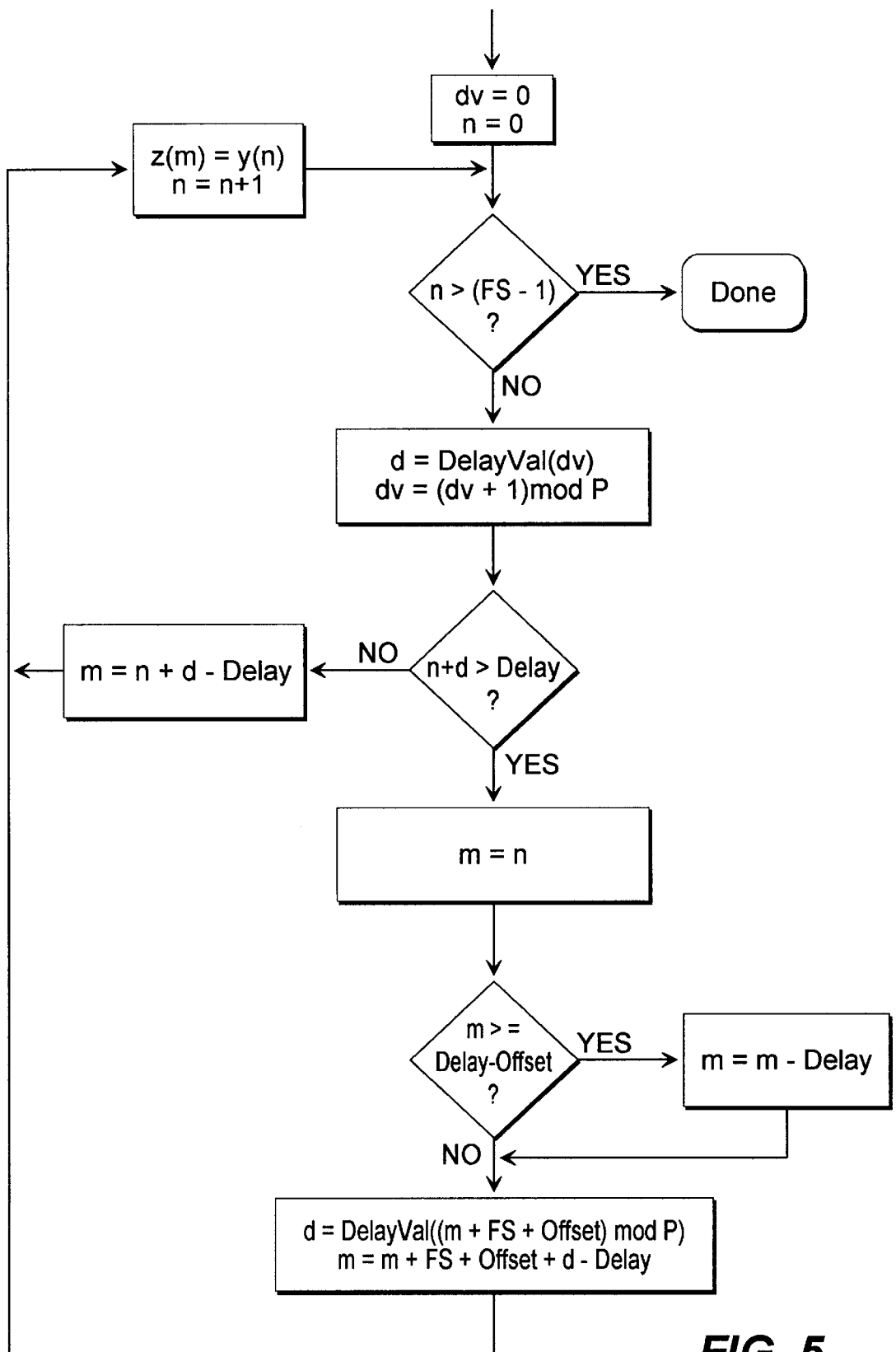
FIG. 5 is a flow chart illustrating the manner in which the de-interleaver of the present invention operates.

Similarly, the de-interleaver algorithm is described in the flow chart of FIG. 5 which implements the following pseudocode:

$dv = 0$

For $n = 0$ to $FS - 1$ $d = DelayVal(dv)$ $dv = (dv + 1) \bmod P$

If $n + d < Delay$ then $m = n$

If $m \geq Delay - \textit{Offset}$ then $m = m - Delay$

End if $d = DelayVal((m + FS + \textit{Offset}) \bmod P)$ $m = m + FS + \textit{Offset} + d - Delay$ Else $m = n + d - Delay$ End if $z(m) = y(n)$ Next $n$ By way of specific example, a frame based modulus interleaver and de-interleaver is shown below, in Table II, for the following parameters:

P=5;

D=2;

FS=18;

S=1;

Offset=2

Using the algorithm set forth above (See FIG. 3), the de-interleaver values for DelayVal(0) through DelayVal(4) can be determined (from the values of P and D) to be:

DelayVal(0)=4;

DelayVal(1)=0;

DelayVal(2)=6;

DelayVal(3)=2;

DelayVal(4)=8;

The values of S and Offset depend on P, D, and FS. As there are combinations of P, D, and FS for which no values of S and Offset can be found which satisfy the criteria for the frame based modulus interleaver of the present invention, i.e., there are combinations of values of P, D, and FS for which it is not possible to generate a unique interleaved index within the original frame for each input sample, P, D, and FS must be selected such that the relationships shown in the following rules are satisfied:

1. FS must be greater than or equal to the interleaver propagation delay, of D(P−1).
2. For K=(FS−(P*D)) mod P, S and Offset are selected from Table I, below. If more than one relationship applies (which may be the case for P<5), any valid relationship will result in a valid set of parameters. Note that for the special case of D=1, valid sets of S and Offset can always be found, regardless of frame size, FS.

As a frame size, FS, of 18 was selected, using the foregoing values for FS, P, and D, the value of K is found to be (18−(5*2) mod 5), i.e., K=3. Using Table I, below, it can be seen that as K=P−2, S should be chosen to be 1, and Offset should be chosen to be 2, as set forth above.

TABLE I

| D | K | S | Offset |
|---|---|---|--------|
| Any | P-2 | 1 | 2 |
| Any | P-1 | 0 | 1 |
| Any | 0 | 0 | 0 |
| Any | 1 | 0 | D(P − 1) − 1 |
| Any | 2 | P-1 | D(P − 1) − 2 |
| 1 | Even | (P-K/2) mod P | 0 |
| 1 | Odd | (P-K)/2 | 0 |
| none of the above | | | not valid |

Referring now to Table II, below, the interleaving in accordance with the present invention, using the foregoing values, is illustrated. Bold entries in Table II identify samples which were relocated as a result of the frame-based modulus process of the present invention.

In general, the interleaver algorithm may be implemented in-place, so that no additional buffering is needed beyond that necessary to hold the current frame's data. Since samples from the end of the frame are wrapped back to the beginning of the frame, the interleaver algorithm must be performed on the entire frame of data (not on a sample-by-sample, i.e., not on a block-by-block, basis).

The de-interleaver (receiver) algorithm can be performed as the samples are received in real-time. Since the wrapped values are available (at the beginning of the frame) before they are needed (at the end of the frame), no delay is added as a result of the use of the frame modulus operation of the present invention.

Those skilled in the art will recognize that while in the preferred embodiment of the invention the interleaver delay values increment sequentially, and the de-interleaver values are determined algorithmically, the invention can also be implemented so that the de-interleaver delay values increment sequentially. In that case, the values for the interleaver delays (rather than the de-interleaver delays) would be determined algorithmically, and corresponding sets of rules can be generated for determination of P, D, FS, S, and Offset. As will be recognized, the relationship between P, D, and FS would be somewhat more limited than in the case described above.

Figure 6:
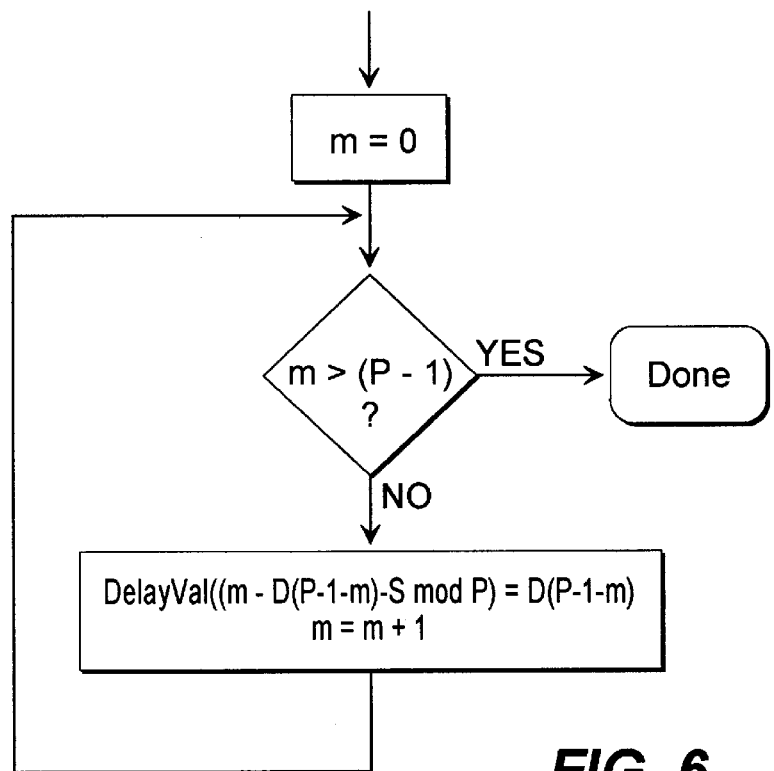
FIG. 6 is a flow chart illustrating the manner in which the members of the DelayVal( ) array are selected in an alternative embodiment of the invention.
Figure 7:
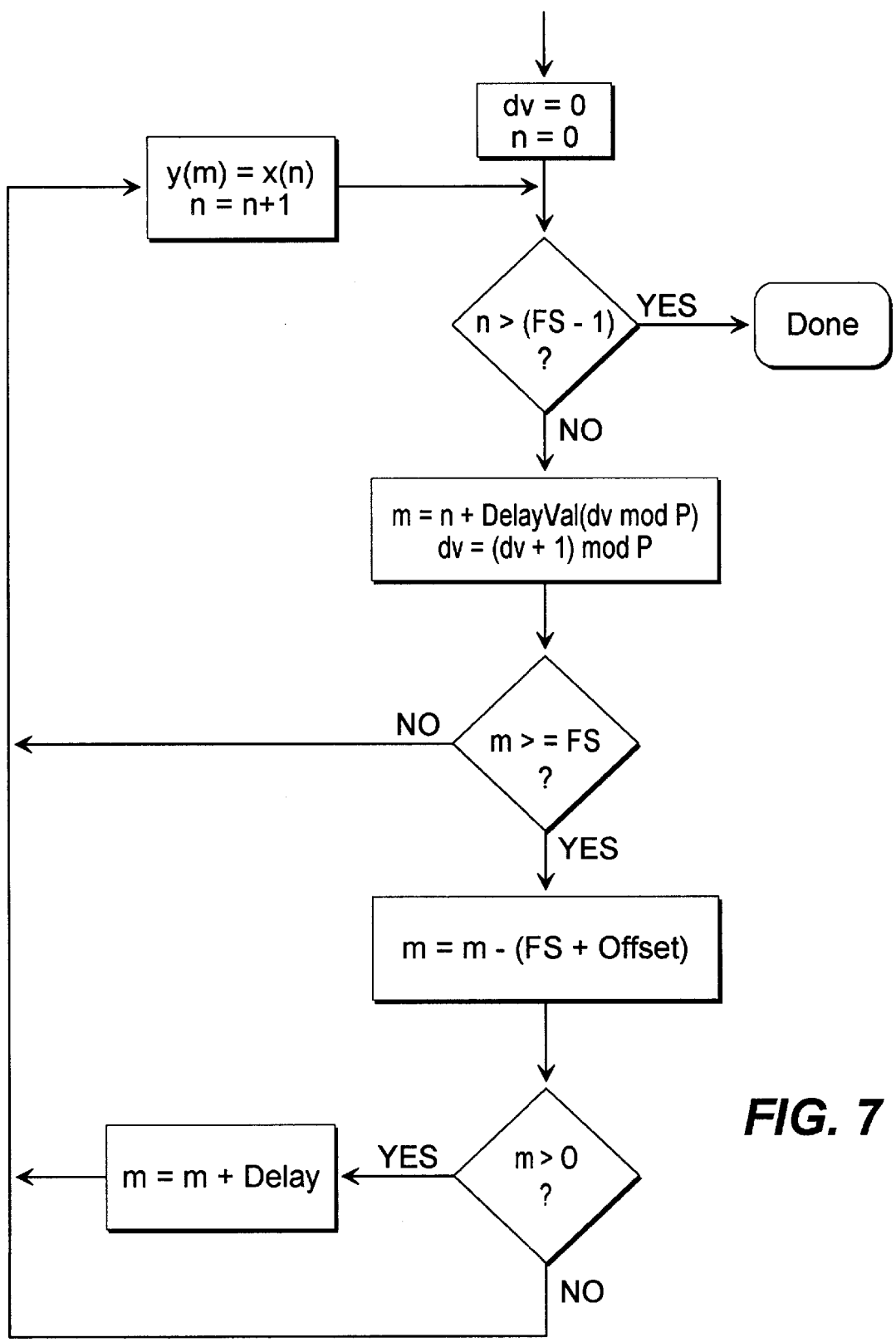
FIG. 7 is a flow chart illustrating the manner in which the interleaver of the alternative embodiment of the invention operates.

Thus, the algorithm to determine DelayValo( ) can be determined in accordance with the procedure set forth in the flow chart of FIG. 6 which implements the following pseudocode:

For $m = 0$ to $(P-1)$ $DelayVal((m - D(P - 1 - m) - S) \bmod P) = D(P - 1 - m)$ Next $m$ Similarly, the interleaver algorithm would be modified to conform to FIG. 7, and in pseudocode as follows:

$dv = 0$

For $n = 0$ to $FS - 1$ $m = n + DelayVal(dv \bmod P)$ $dv = (dv + 1) \bmod P$

If $m \geq FS$ then $m = m - (FS + \textit{Offset})$

If $m < 0$ then $m = m - \textit{Delay}$

End if

TABLE II

| | | | | | | | | | | | | | | | | | | |
|---|---|---|---|---|---|---|---|---|---|---|---|---|---|---|---|---|---|---|
| original sequence | x0 | x1 | x2 | x3 | x4 | x5 | x6 | x7 | x8 | x9 | x10 | x11 | x12 | x13 | x14 | x15 | x16 | x17 |
| interleaver delay | 2 | 4 | 6 | 8 | 0 | 2 | 4 | 6 | 8 | 0 | 2 | 4 | 6 | 8 | 0 | 2 | 4 | 6 |
| interleaved sequence | x16 | x13 | x0 | x17 | x4 | x1 | x12 | x5 | x2 | x9 | x6 | x3 | x10 | x7 | x14 | x11 | x8 | x15 |
| de-interleaver delay | 4 | 0 | 6 | 2 | 8 | 4 | 0 | 6 | 2 | 8 | 4 | 0 | 6 | 2 | 8 | 4 | 0 | 6 |
| De-interleaved sequence (delay removed) | x0 | x1 | x2 | x3 | x4 | x5 | x6 | x7 | x8 | x9 | x10 | x11 | x12 | x13 | x14 | x15 | x16 | x17 |

-continued

```
    End if
    y(m) = x(n)
Next n
```

Figure 8:
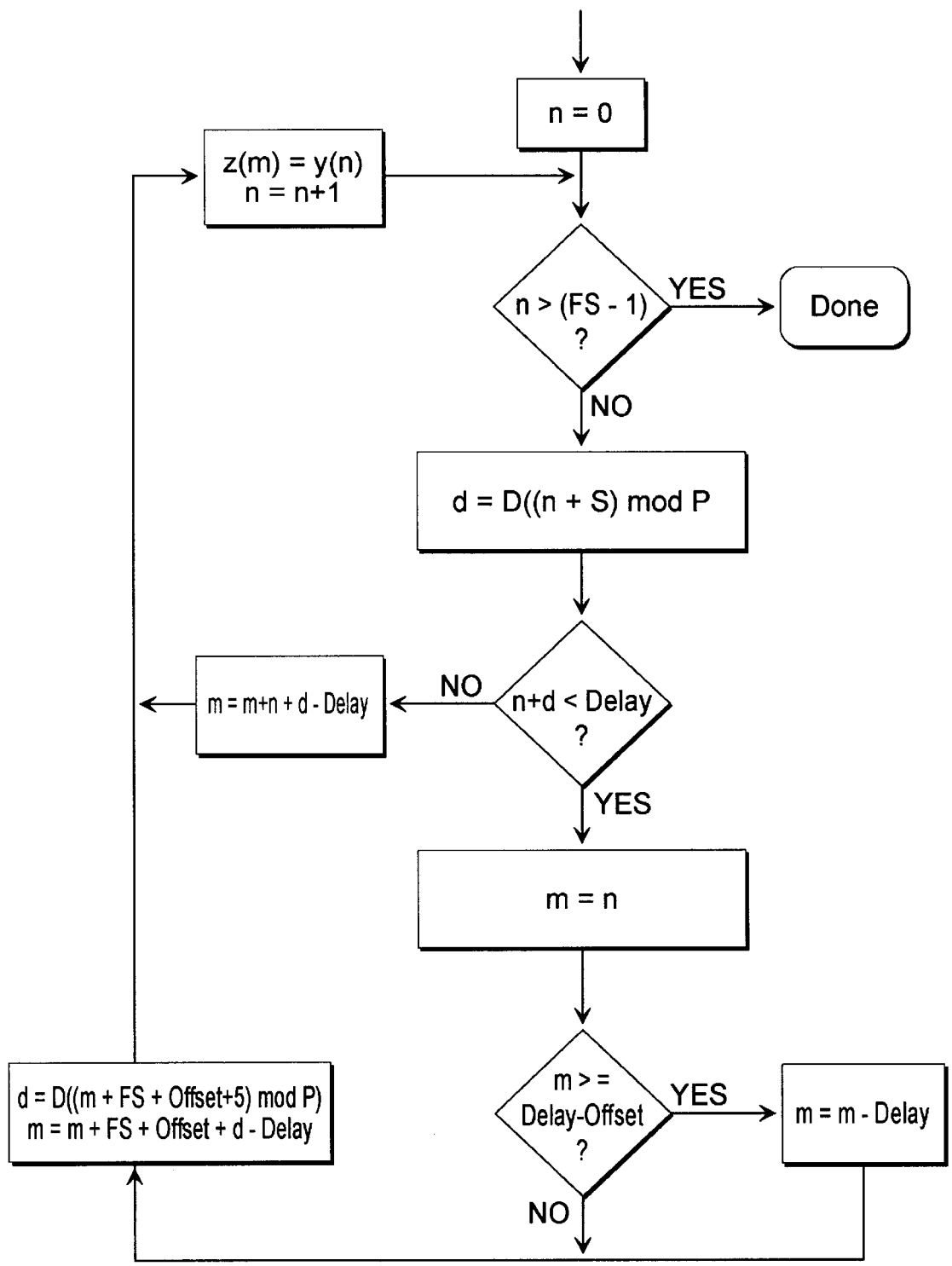
FIG. 8 is a flow chart illustrating the manner in which the de-interleaver of the alternative embodiment of the invention operates.

The de-interleaver algorithm, illustrated in the flow chart of FIG. 8, would be expressed in pseudocode as:

```
For n = 0 to (FS − 1)
    d = D((n + S) mod P)
    If n + d < Delay then
        m = n
        If m >= Delay − Offset then
            m = m − Delay
        End if
        d = D((m + FS + Offset + S) mod P)
        m = m + FS + Offset + d − Delay
    Else
        m = n + d − Delay
    End if
    z(m) = y(n)
Next n
```

By way of specific example, a frame based modulus interleaver and de-interleaver is shown below, in Table II, for the following parameters:

index within the original frame for each input sample, P, D, and FS must be selected such that the relationships shown in the following rules are satisfied:

1. FS must be greater than or equal to the interleaver propagation delay, of D(P−1).
2. For K=(FS−(P*D)) mod P, S and Offset are selected from Table III, below. If more than one relationship applies, any valid relationship will result in a valid set of parameters.

As a frame size, FS, of 19 was selected, using the foregoing values for FS, P, and D, the value of K is found to be (19−(5*2) mod 5), i.e., K=4. Using Table III, below, it can be seen that as K=P−1, S should be chosen to be 3, and Offset should be chosen to be 1, as set forth above.

TABLE III

| D | K | S | Offset |
|---|---|---|--------|
| Any | 0 | P − 1 | 0 |
| Any | 1 | P − 1 | D(P − 1) − 1 |
| Any | P − 1 | D + 1 | 1 |
| P − 2 | 2 | D | D(P − 1) − 2 |
| P − 2 | P − 2 | 0 | 2 |
| 1 | 2 | P − 1 | P − 2 |
| 1 | P − 2 | 2 | 1 |
| 1 | 4n + 1 | P − 2n | P − (2n + 1) |
| 1 | P − (4n + 1) | 2n + 1 | 2n |
| none of the above | | | not valid |

Referring now to Table IV, below, the interleaving in accordance with the present invention, using the foregoing values, is illustrated. Bold entries in Table IV identify samples which were relocated as a result of the frame-based modulus process of the present invention.

TABLE IV

| | | | | | | | | | | | | | | | | | | | |
|---|---|---|---|---|---|---|---|---|---|---|---|---|---|---|---|---|---|---|---|
| original sequence | x0 | x1 | x2 | x3 | x4 | x5 | x6 | x7 | x8 | x9 | x10 | x11 | x12 | x13 | x14 | x15 | x16 | x17 | x18 |
| interleaver delay | 4 | 0 | 6 | 2 | 8 | 4 | 0 | 6 | 2 | 8 | 4 | 0 | 6 | 2 | 8 | 4 | 0 | 6 | 2 |
| interleaved sequence | x18 | x1 | x14 | x17 | x0 | x3 | x6 | x15 | x2 | x5 | x8 | x11 | x4 | x7 | x10 | x13 | x16 | x9 | x12 |
| de-interleaver delay | 6 | 8 | 0 | 2 | 4 | 6 | 8 | 0 | 2 | 4 | 6 | 8 | 0 | 2 | 4 | 6 | 8 | 0 | 2 |
| De-interleaved sequence (delay removed) | x0 | x1 | 2 | x3 | x4 | x5 | x6 | x7 | x8 | x9 | x10 | x11 | x12 | x13 | x14 | x15 | x16 | x17 | x18 |

P=5;
D=2;
FS=19;
S=3;
Offset=1

Using the algorithm set forth above (See FIG. 6), the de-interleaver values for DelayVal(0) through DelayVal(4) can be determined (from the values of P and D) to be:

DelayVal(0)=4;
DelayVal(1)=0;
DelayVal(2)=6;
DelayVal(3)=2;
DelayVal(4)=8;

The values of S and Offset depend on P, D, and FS. As there are combinations of P, D, and FS for which no values of S and Offset can be found which satisfy the criteria for the frame based modulus interleaver of the present invention, i.e., there are combinations of values of P, D, and FS for which it is not possible to generate a unique interleaved

I claim:

1. An improved interleaver capable of handling variable-sized frames, for use in a communications system, of the type which receives an input frame comprising a plurality of data blocks, and outputs an output frame having said data blocks interleaved therein, the interleaver comprising interleaver logic configured to ensure that each output frame has the same frame size, FS, as said input frame, wherein said logic provides that each output frame contains all of the data blocks which were contained in said input frame and wherein said logic makes use of an interleaver delay sequence of length P, wherein the increment between respective values in said delay sequence is D, and wherein said logic receives the frame size, FS, the delay sequence length, P, and the increment, D, as parameters to be used to produce the output frame having the data blocks interleaved therein, and wherein the interleaver logic is configured to ensure that the output frame has the frame size, FS.

2. The improved interleaver of claim 1, wherein said interleaver further includes a base value, S, and an offset value, Offset, which are determined from the values of P, D and FS, such that for K equal to (FS−P*D) mod P, values of S and Offset are selected from the following table:

| D | K | S | Offset |
|---|---|---|---|
| Any | P − 2 | 1 | 2 |
| Any | P − 1 | 0 | 1 |
| Any | 0 | 0 | 0 |
| Any | 1 | 0 | D(P − 1) − 1 |
| Any | 2 | P − 1 | D(P − 1) − 2 |
| 1 | Even | (P − K/2) mod P | 0 |
| 1 | Odd | (P − K)/2 | 0 |
| none of the above | | not valid | |

3. The improved interleaver of claim 2, wherein said interleaver logic data blocks from a location, n, within an input frame to a location, m, in an output frame associated with said input frame, whereby all of the data blocks in said input frame are moved into said output frame, said interleaving interleaver operating in accordance with procedure set forth in the following steps:

For $n = 0$ to $(FS − 1)$ $m = n + D((n + S) \bmod P)$

If $m \geq FS$ then $m = m − (FS + \text{Offset})$

If $m < 0$ then $m = m + \text{Delay}$

End if

End if $y(m) = x(n)$

Next $n$.

4. A de-interleaver for use with the invention defined in claim 3, said de-interleaver rearranging data blocks in a received frame of data into the sequence corresponding to the sequence which said data blocks had when they were input into said interleaver.

5. The de-interleaver of claim 4, wherein said de-interleaver logic makes use of P delay values, DelayVal( ), said delay values being determined in accordance with the following procedure:

For $n = 0$ to $(P − 1)$ $m = n + Dn$ $\text{DelayVal}((m − S) \bmod P) = D(P − 1) − Dn$ Next $n$.

6. The de-interleaver of claim 5, which receives a frame of data having data blocks y(n), where n ranges from 0 to FS-1, said de-interleaver logic moving a data block from position n to position m in a de-interleaver output data block, z(m), said de-interleaver logic operating in accordance with the following steps:

$dv = 0$

For $n = 0$ to $FS − 1$

-continued $d = \text{DelayVal}(dv)$ $dv = (dv + 1) \bmod P$

If $n + d < \text{Delay}$ then $m = n$

If $m \geq \text{Delay} − \text{Offset}$ then $m = m − \text{Delay}$

End if $d = \text{DelayVal}((m + FS + \text{Offset}) \bmod P)$ $m = m + FS + \text{Offset} + d − \text{Delay}$ Else $m = n + d − \text{Delay}$ End if $z(m) = y(n)$ Next $n$.

7. An improved de-interleaver, for use in a communications system, of the type which receives an input frame comprising a plurality of interleaved data blocks, and outputs an output frame having said interleaved data blocks de-interleaved therein, the de-interleaver logic configured to ensure that each output frame has the same frame size, FS, as said input frame and for providing that each output frame contains all of the data blocks which were contained in said input frame, wherein said de-interleaver logic makes use of a de-interleaver delay sequence of length P, wherein the increment between respective values in said delay sequence is D, and wherein said de-inteleaver logic receives the frame size, FS, the delay sequence length, P, and the increment, D, as parameters to be used to produce the output frame having the de-interleaved data blocks therein, and wherein the de-interleaver logic is configured to ensure that the output frame has the frame size, FS.

8. The improved de-interleaver logic of claim 7, wherein said de-interleaver further includes a base value, S, and an offset value, Offset, which are determined from the values of P, D and FS, such that for FS greater than or equal to the interleaver propagation delay of D(P−1) and for K equal to (FS−P*D) mod P, values of S and Offset are selected from the following table:

| D | K | S | Offset |
|---|---|---|---|
| Any | 0 | P − 1 | 0 |
| Any | 1 | P − 1 | D(P − 1) − 1 |
| Any | P − 1 | D + 1 | 1 |
| P − 2 | 2 | D | D(P − 1) − 2 |
| P − 2 | P − 2 | 0 | 2 |
| 1 | 2 | P − 1 | P − 2 |
| 1 | P − 2 | 2 | 1 |
| 1 | 4n + 1 | P − 2n | P − (2n + 1) |
| 1 | P − (4n + 1) | 2n + 1 | 2n |
| none of the above | | not valid | |

9. The improved de-interleaver of claim 8, wherein said de-interleaver logic moves data blocks from a location, n, within an input frame to a location, m, in an output frame associated with said input frame, whereby all of the data blocks in said input frame are moved into said output frame, said de-interleaver logic operating in accordance with the following steps:

For $n = 0$ to $(FS - 1)$
    $d = D((n + S) \bmod P)$
    If $n + d <$ Delay then
        $m = n$
        If $m >=$ Delay $-$ Offset then
            $m = m -$ Delay
        End if
    $d = D((m + FS +$ Offset $+ S) \bmod P)$ -continued $m = m + FS +$ Offset $+ d -$ Delay
    Else
        $m = n + d -$ Delay
    End if
    $z(m) = y(n)$
Next $n$.

* * * * *

UNITED STATES PATENT AND TRADEMARK OFFICE
CERTIFICATE OF CORRECTION

PATENT NO.    : 5,933,431
DATED         : August 3, 1999
INVENTOR(S)   : Kenneth David Ko It is certified that error appears in the above-identified patent and that said Letters Patent is hereby corrected as shown below:

Column 6,
Line 26, please delete "Delay Valo()" and insert therefor -- DelayVal() --.
Line 51, please delete "m = m - Delay" and insert therefor -- m = m + Delay --.

TABLE II, column 2, row 3, please delete "x16" and insert therefor -- x16 --.
TABLE II, column 3, row 3, please delete "x13" and insert therefore x13 --.
TABLE II, column 5, row 3, please delete "x17" and insert therefor -- x17 --.
TABLE II, column 8, row 3, please delete "x12" and insert therefor -- x12 --.
TABLE II, column 14, row 5, please delete "x12" and insert therefor -- x12 --.
TABLE II, column 15, row 5, please delete "x13" and insert therefor -- x13 --.
TABLE II, column 18, row 5, please delete "x16" and insert therefor -- x16 --.
TABLE II, column 19, row 5, please delete "x17" and insert therefor -- x17 --.
TABLE IV, column 2, row 3, please delete "x18" and insert therefor -- x18 --.
TABLE IV, column 4, row 3, please delete "x14" and insert therefor -- x14 --.
TABLE IV, column 5, row 3, please delete "x17" and insert therefor -- x17 --.
TABLE IV, column 9, row 3, please delete "x15" and insert therefor -- x15 --.
TABLE IV, column 16, row 5, please delete "x14" and insert therefor -- x14 --.
TABLE IV, column 17, row 5, please delete "x15" and insert therefor -- x15 --.
TABLE IV, column 19, row 5, please delete "x17" and insert therefor -- x17 --
TABLE IV, column 20, row 5, please delete "x18" and insert therefor -- x18 --.

Column 8,
Line 66, between "interleaver" and "further" insert -- logic --.

Column 9,
Line 16, between "logic" and "data" insert -- further includes logic for moving --.
Line 40, between "de-interleaver" and "rearranging" insert -- including de-interleaver logic for --.

UNITED STATES PATENT AND TRADEMARK OFFICE
CERTIFICATE OF CORRECTION

PATENT NO.   : 5,933,431
DATED        : August 3, 1999
INVENTOR(S)  : Kenneth David Ko It is certified that error appears in the above-identified patent and that said Letters Patent is hereby corrected as shown below:

Column 10,
Line 28, between "de-interleaver" and "logic" insert -- comprising de-interleaver --.
Line 41, please delete "logic".
Line 42, please insert -- logic -- between "de-interleaver" and "further".
Line 62, please delete "moves" and insert therefor -- further includes logic for moving --.

Signed and Sealed this

Fifteenth Day of January, 2002

Attest:

JAMES E. ROGAN
Attesting Officer     Director of the United States Patent and Trademark Office